US012690220B2

(12) United States Patent
Cheng

(10) Patent No.: US 12,690,220 B2
(45) Date of Patent: Jul. 21, 2026

(54) SEMICONDUCTOR STRUCTURE COMPRISING A CHANNEL LAYER, A BARRIER LAYER, AND A P-TYPE SEMICONDUCTOR LAYER, AND MANUFACTURING METHOD HAVING THE SAME THEREOF

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 364 days.

(21) Appl. No.: 18/491,600

(22) Filed: Oct. 20, 2023

(65) Prior Publication Data
US 2024/0222489 A1 Jul. 4, 2024

(30) Foreign Application Priority Data
Dec. 31, 2022 (CN) .......................... 202211735375.3

(51) Int. Cl.
| | |
|---|---|
| *H10D 30/47* | (2025.01) |
| *H10D 30/01* | (2025.01) |
| *H10D 62/85* | (2025.01) |
| *H10P 30/20* | (2026.01) |
| *H10P 30/22* | (2026.01) |

(52) U.S. Cl.
CPC ......... *H10D 30/475* (2025.01); *H10D 30/015* (2025.01); *H10D 62/8503* (2025.01); *H10P 30/206* (2026.01); *H10P 30/208* (2026.01); *H10P 30/22* (2026.01)

(58) Field of Classification Search
CPC .............. H10D 30/475; H10D 30/015; H10D 62/8503; H01L 21/2654; H01L 21/266
USPC .......................................................... 257/76
See application file for complete search history.

(56) References Cited

FOREIGN PATENT DOCUMENTS

| | | | | | |
|---|---|---|---|---|---|
| CN | 115050829 A | * | 9/2022 | .......... | H10D 30/015 |
| FR | 3084966 A1 | * | 2/2020 | .......... | H10D 62/852 |
| WO | WO-2022068835 A1 | * | 4/2022 | .......... | H10D 30/015 |

* cited by examiner

*Primary Examiner* — Phuc T Dang
(74) *Attorney, Agent, or Firm* — Carroll, Hoette & Butscher, LLC; Christopher R. Carroll

(57) ABSTRACT
The present disclosure provides a semiconductor structure, including a substrate, a channel layer, a barrier layer, and a P-type semiconductor layer that are distributed from bottom to top, where the barrier layer includes an Al element, and a variation curve of a proportion of Al element in the barrier layer is continuous; where at an interface between the channel layer and the barrier layer, the proportion of Al element in the barrier layer is the same as the proportion of Al element in the channel layer; and at an interface between the barrier layer and the P-type semiconductor layer, the proportion of Al element in the barrier layer is the same as the proportion of Al element in the P-type semiconductor layer.

17 Claims, 9 Drawing Sheets

13

14

12

11

10

13

15

12

11

10

SEMICONDUCTOR STRUCTURE COMPRISING A CHANNEL LAYER, A BARRIER LAYER, AND A P-TYPE SEMICONDUCTOR LAYER, AND MANUFACTURING METHOD HAVING THE SAME THEREOF

CROSS REFERENCE TO RELATED APPLICATIONS

This application claims priority to Chinese Patent Application No. 2022117353753 filed on Dec. 31, 2022, the entire content of which is incorporated herein by reference.

TECHNICAL FIELD

The present disclosure relates to the field of semiconductor technology, in particular to semiconductor structures and manufacturing methods thereof.

BACKGROUND

In related technologies, commonly used HEMT (High Electron Mobility Transistor) devices are mostly based on metal-polarity AlGaN/GaN heterojunction structures. These devices have problems of a high Al proportion in a surface and a long distance between a 2DEG (two-dimensional electron gas) conductive channel and a device surface, resulting in high contact resistance and series resistance, suppressing a current density and a power density of the device. In addition, due to the presence of spontaneous polarization and piezoelectric polarization at the AlGaN/GaN heterojunction interface, the concentration of the 2DEG at the AlGaN/GaN heterojunction interface is high, which affects the gate control ability of the device, suppresses electron mobility and saturation rate, that is, there is a trade-off between carrier concentration and mobility. The decrease in electron mobility and saturation rate can cause a significant decrease in the transconductance of a transistor, resulting in problems such as nonlinear transmission characteristics and signal distortion, and moreover, there is a common phenomenon of poor carrier limiting ability and high device leakage, which is not conducive to the off-state breakdown characteristics of devices and on-state current saturation under a large bias voltage.

SUMMARY

In view of this, in the first aspect, the present disclosure provides a semiconductor structure, including a substrate, a channel layer, a barrier layer, and a P-type semiconductor layer that are distributed from bottom to top, where the barrier layer includes an Al element, and a variation curve of a proportion of Al element in the barrier layer is continuous; where at an interface between the channel layer and the barrier layer, the proportion of Al element in the barrier layer is the same as the proportion of Al element in the channel layer; and at an interface between the barrier layer and the P-type semiconductor layer, the proportion of Al element in the barrier layer is the same as the proportion of Al element in the P-type semiconductor layer.

In some embodiments, the P-type semiconductor layer includes an Al element, and in a direction from the channel layer to the P-type semiconductor layer, a variation curve of the proportion of Al element in the channel layer, the barrier layer, and the P-type semiconductor layer is continuous.

In some embodiments, in a direction from the channel layer to the P-type semiconductor layer, a derivative of the variation curve of the proportion of Al element with respect to a thickness is continuous.

In some embodiments, in a direction from the channel layer to the barrier layer, the barrier layer includes one or more of a region with the proportion of Al element increasing, a region with the proportion of Al element decreasing, or a region with the proportion of Al element being constant.

In some embodiments, in a direction from the channel layer to the barrier layer, a process of the proportion of Al element first increasing from a minimum to a maximum and then decreasing from the maximum to a minimum is a fluctuation period, and the barrier layer includes at least one fluctuation period.

In some embodiments, in the direction from the channel layer to the barrier layer, in the at least one fluctuation period, an increasing speed of the proportion of Al element is greater than a decreasing speed of the proportion of Al element.

In some embodiments, in a direction from the barrier layer to the P-type semiconductor layer, the proportion of Al element in the P-type semiconductor layer is constant, gradually decreases or first decreases to 0 and then remains at 0.

In some embodiments, in a direction from the barrier layer to the P-type semiconductor layer, a process of the proportion of Al element first increasing from a minimum to a maximum and then decreasing from the maximum to a minimum is a fluctuation period, and there is at least one fluctuation period from the barrier layer to the P-type semiconductor layer.

In some embodiments, there is one fluctuation period from the barrier layer to the P-type semiconductor layer, and a maximum value of the proportion of Al element is located at an interface between the barrier layer and the P-type semiconductor layer or in the barrier layer.

In some embodiments, there are multiple fluctuation periods from the barrier layer to the P-type semiconductor layer, and in the direction from the barrier layer to the P-type semiconductor layer, maximum values of the proportion of Al element in the multiple fluctuation periods gradually decreases.

In some embodiments, the semiconductor structure further includes a back barrier layer located on a side of the channel layer far from the barrier layer, where the back barrier layer includes an Al element, and at an interface between the channel layer and the back barrier layer, the proportion of Al element in the back barrier layer is the same as the proportion of Al element in the channel layer.

In some embodiments, the semiconductor structure further includes an inactive layer located on an upper surface of the barrier layer and connected to the P-type semiconductor layer.

In some embodiments, the semiconductor structure further includes an ion passivation layer located on an upper surface of the barrier layer and connected to the P-type semiconductor layer.

In the second aspect, the present disclosure provides a manufacturing method of a semiconductor structure, including: sequentially forming a channel layer, a barrier layer, and a P-type semiconductor layer on a substrate, where the barrier layer includes an Al element, and a variation curve of a proportion of Al element in the barrier layer is continuous; where at an interface between the channel layer and the barrier layer, the proportion of Al element in the barrier layer is the same as the proportion of Al element in the channel layer; and at an interface between the barrier layer and the P-type semiconductor layer, the proportion of Al element in the barrier layer is the same as the proportion of Al element in the P-type semiconductor layer.

In some embodiments, the P-type semiconductor layer includes an Al element, and in a direction from the channel layer to the P-type semiconductor layer, a variation curve of the proportion of Al element in the channel layer, the barrier layer, and the P-type semiconductor layer is continuous.

In some embodiments, forming the P-type semiconductor layer includes: forming a P-type ion doped layer on the surface of the barrier layer far from the channel layer; forming a first mask layer on a surface of the P-type ion doped layer far from the barrier layer, where the first mask layer has a first opening; activating P-type doped ions in the P-type ion doped layer by using the first mask layer as a mask, such that the P-type doped ions in the P-type ion doped layer exposed by the first opening are activated to form the P-type semiconductor layer, and the P-type doped ions in the P-type ion doped layer covered by the first mask layer are not activated to form an inactive layer.

In some embodiments, forming the P-type semiconductor layer includes: forming a P-type ion doped layer on the surface of the barrier layer far from the channel layer, activating P-type doped ions in the P-type ion doped layer to form the P-type semiconductor layer; forming a second mask layer on a surface of the P-type semiconductor layer far from the barrier layer, and the second mask layer has a second opening; and implanting H ions into the P-type semiconductor layer by using the second mask layer as a mask, such that the P-type doped ions in the P-type semiconductor layer exposed by the second opening are passivated to form an ion passivation layer, and the P-type doped ions in the P-type semiconductor layer covered by the second mask layer are not passivated to retain the P-type semiconductor layer.

For the high electron mobility transistor provided in the embodiments of the present disclosure, a channel layer is formed on the substrate, a barrier layer is formed on the channel layer, and a source electrode, a drain electrode, and a Schottky gate electrode between the source electrode and drain electrode are formed on the barrier layer, where a P-type semiconductor layer is arranged between the barrier layer and the Schottky gate electrode, and at the interface between the channel layer and the barrier layer, the Al composition proportion of the channel layer and the Al composition proportion of the barrier layer are the same, and the proportion of Al component of which proportion varies is 0, which can adjust the two-dimensional electron gas concentration at the interface between the barrier layer and the channel layer.

DETAILED DESCRIPTION

Embodiments will be described in detail herein, examples of which are illustrated in the accompanying drawings. Where the following description refers to the drawings, elements with the same numerals in different drawings refer to the same or similar elements unless otherwise indicated. Embodiments described in the illustrative examples below are not intended to represent all embodiments consistent with the present disclosure. Rather, they are merely embodiments of devices and methods consistent with some aspects of the present disclosure as recited in the appended claims.

The term used in the present disclosure is for the purpose of describing particular embodiments only and is not intended to limit the present disclosure. As used in the present disclosure and the appended claims, the singular forms "a", "an" and "the" are intended to include the plural forms as well, unless the context clearly indicates otherwise. It should further be understood that the term "and/or" as used herein refers to and includes any and all possible combinations of one or more of the associated listed items.

Figure 1:
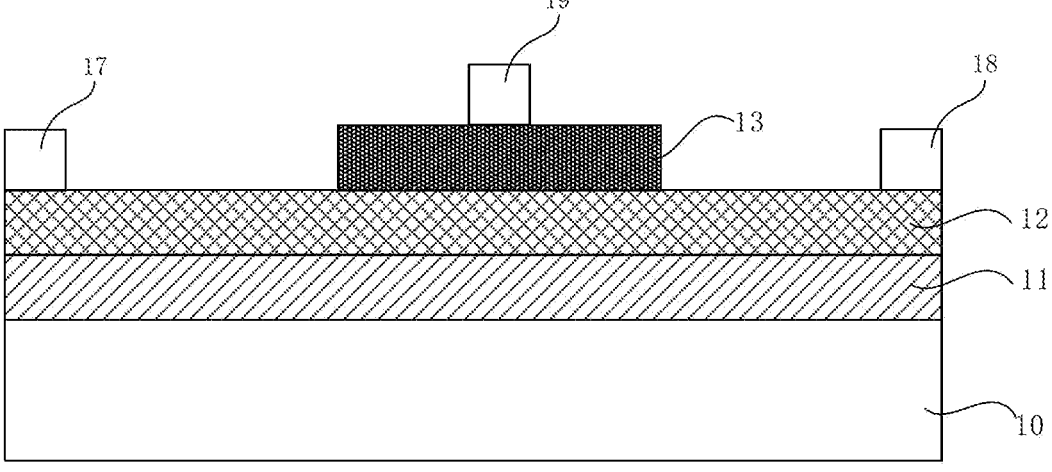
FIG. 1 is a schematic diagram of a semiconductor structure according to embodiments of the present disclosure.

To improve the gate control capability of the HEMT device, referring to FIG. 1, this disclosure provides a semiconductor structure, including a substrate 10, a channel layer 11, a barrier layer 12, and a P-type semiconductor layer 13 that are distributed from bottom to top, a source electrode 17 and a drain electrode 18 that are located on the barrier layer 12, and a gate electrode 19 located between the source electrode 17 and the drain electrode 18. The channel layer 11 and the barrier layer 12 are both nitride semiconductors. The barrier layer 12 includes Al element, and a variation curve of a proportion of Al element in the barrier layer is continuous.

Figure 2:
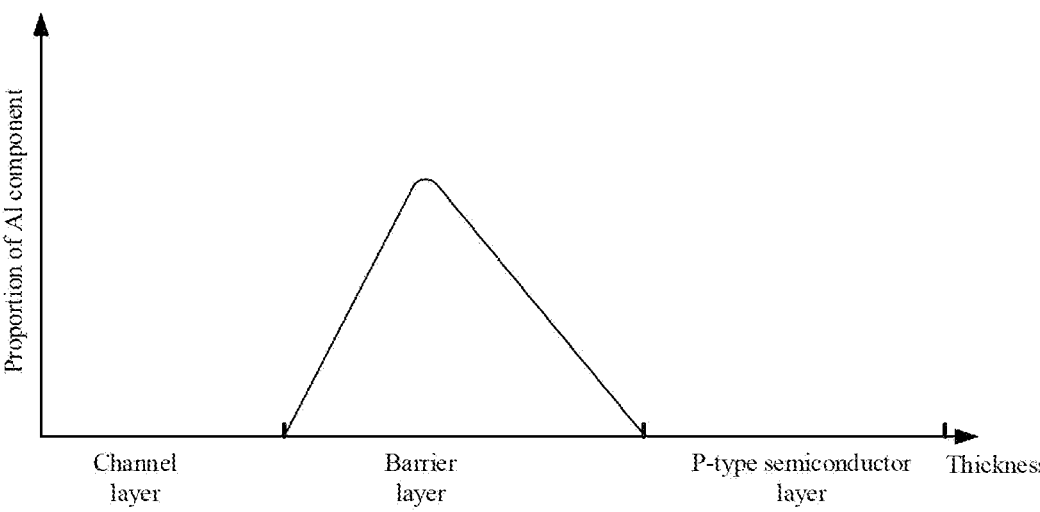
FIG. 2 is a variation curve of a proportion of Al component in a semiconductor structure according to embodiments of the present disclosure.

In some embodiments, the substrate 10 can include a sapphire substrate, SiC substrate, Si substrate, AlN substrate, or other monocrystal substrate that can be used for nitride epitaxial growth. The channel layer 11 and the barrier layer 12 can include a GaN-based material. For example, the channel layer 11 includes GaN, and the barrier layer 12 includes $Al_xGa_yN$, where x represents the proportion of Al component in barrier layer 12. As shown in FIG. 2, FIG. 2 is a variation curve of a proportion of Al component in a semiconductor structure. In FIG. 2, the horizontal axis represents a distance (which can be referred to as thickness) from a surface of the substrate 10, and the vertical axis represents the proportion of Al component. It can be seen that in barrier layer 12, the proportion of Al element continuously varies in the direction from channel layer 11 to the barrier layer 12 (i.e. from bottom to top in the figure), and at the interface between the channel layer 11 and the barrier layer 12, the proportion of Al element in the barrier layer 12 is the same as the proportion of Al element in the channel layer 11 and both are 0; at the interface between the barrier layer 12 and the P-type semiconductor layer 13, the proportion of Al element in the barrier layer 12 is the same as the proportion of Al element in the P-type semiconductor layer 13 and both are 0.

Therefore, there is no difference in component proportion at the interface between the barrier layer 12 and the channel layer 11, which reduces the spontaneous polarization and piezoelectric polarization at the interface, effectively reduces the 2DEG concentration at the interface. A flat conduction band below the Fermi level is formed at the interface, which is beneficial for improving the gate control ability of the semiconductor structure. A barrier layer includes a component of which proportion gradually varies, and at the interface between the barrier layer and the channel layer, a three-dimensional electron gas or three-dimensional hole gas is formed by polarization induced doping, which can improve the high-frequency linearity of the transistor. By adjusting the Al component proportion curve in the barrier layer 12, the linearity of the semiconductor structure under the high-frequency can be effectively controlled, the gate control ability can be improved, the threshold voltage can be further increased, the reverse leakage of the gate Schottky junction can be suppressed, and the breakdown voltage can be increased. In addition, since the proportion of Al component in the barrier layer 12 is the same as the proportion of Al component in the channel layer 11, when the barrier layer 12 is grown on the upper surface of the channel layer 11, it can alleviate defects such as dislocations caused by differences in lattice constants and improve crystal quality.

It should be noted that in the disclosed embodiment, the GaN-based material includes both Ga and N elements, but the molar ratios of Ga element and N element are not limited.

In some embodiments, in the direction from the channel layer 11 to the barrier layer 12, the barrier layer 12 may include multiple sublayers. The continuously changing of the proportion of Al component in the barrier layer 12 may be: the proportions of Al component in the multiple sublayers are continuous, such as without jumping, or a difference in the proportion of Al component between adjacent sublayers of the multiple sublayers is within a threshold.

In some embodiments, in a direction from the channel layer 11 to the barrier layer 12, the barrier layer 12 includes one or more of a region with the proportion of Al element increasing, a region with the proportion of Al element decreasing, or a region with the proportion of Al element being constant. The proportion of Al component in the barrier layer 12 first increases and then decreases, or gradually increases.

As shown in FIG. 2, FIG. 2 is a variation curve of a proportion of Al component in a semiconductor structure. It can be seen that there is no Al element doping in the channel layer 11. The barrier layer 12 is doped with Al element, and as the thickness increases, the proportion of Al component increases from 0 and then decreases. In the direction from the channel layer 11 to the barrier layer 12, the proportion of Al component in barrier layer 12 increases from 0, which can create an energy level difference between the barrier layer 12 and the channel layer 11 to form a two-dimensional electron gas. Subsequently, the proportion of Al component in barrier layer 12 gradually decreases in the direction close to the upper surface of barrier layer 12, which can facilitate the release of built-in stress in the P-type semiconductor layer that subsequently grows on the surface of the barrier layer 12.

In some embodiments, in the direction from the channel layer 11 to the barrier layer 12, a process of the proportion of Al element first increasing from a minimum to a maximum and then decreasing from the maximum to a minimum is a fluctuation period. The barrier layer 12 includes multiple fluctuation periods, and the proportion of Al component continuously varies at the interface between adjacent fluctuation periods of the multiple fluctuation periods. For example, for any two adjacent fluctuation periods of the multiple fluctuation periods, at the interface of the two adjacent fluctuation periods, the proportions of Al component of the two adjacent fluctuation periods are the same.

In some embodiments, in the direction from the channel layer 11 to the barrier layer 12, the maximum values of the proportions of Al component in multiple fluctuation periods in barrier layer 12 gradually decrease.

Figure 3:
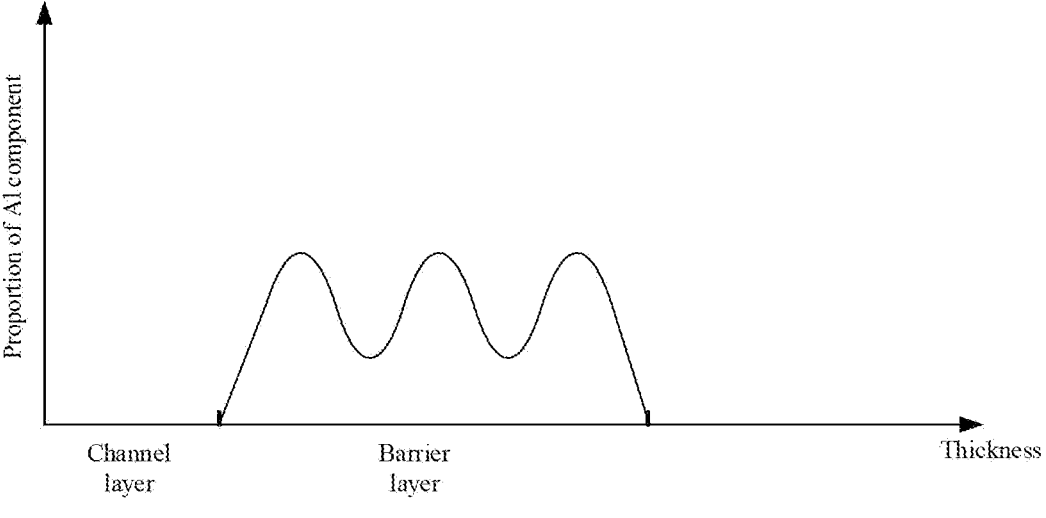
FIG. 3 is a variation curve of a proportion of Al component in a semiconductor structure according to embodiments of the present disclosure.

As shown in FIG. 3, FIG. 3 is a variation curve of a proportion of Al component in a semiconductor structure. In FIG. 3, the horizontal axis represents the thickness, and the vertical axis represents the proportion of Al component. It can be seen that there is no Al element doping in the channel layer 11. The barrier layer 12 is doped with Al element, and the barrier layer 12 includes multiple fluctuation periods. In each fluctuation period, the proportion of Al component increases first and then decreases. As a result, the proportion of Al component in the barrier layer 12 continuously varies, without any sudden changes or jumps in the proportion of a component, which can alleviate the stress problem caused by lattice constant differences in the semiconductor layers. In addition, there are equivalent countless small abrupt heterojunctions in the barrier layer in which the proportion of Al component gradually varies, such that a uniform three-dimensional electron gas is formed, which improves gate control ability. In some embodiments, as the thickness increases, the maximum proportions of Al component in multiple fluctuation periods in barrier layer 12 gradually decrease.

In some embodiments, in the direction from the channel layer 11 to the barrier layer 12, the increasing rate of the proportion of Al component in a fluctuation period in the barrier layer 12 is greater than the decreasing rate. From FIG. 2, it can be seen that as the thickness increases, the rate of increase in the proportion of Al component in barrier layer 12 is greater than the rate of decrease, to achieve a smooth transition between the barrier layer 12 and the subsequent growing P-type semiconductor layer, which is conducive to releasing the built-in stress in the P-type semiconductor layer that subsequently grows on the surface of the barrier layer 12.

As shown in FIG. 1, the source electrode 17 and the drain electrode 18 are located on the barrier layer 12, and the gate electrode 19 is located on the side of the P-type semiconductor layer 13 away from the barrier layer 12. Therefore, when no voltage is applied to the gate electrode 19, the P-type semiconductor layer 13 depletes the three-dimensional electron gas in the barrier layer 12 and channel layer 11, thereby converting the normally open semiconductor structure in the above embodiments into a normally closed semiconductor structure. In addition, the P-type semiconductor layer 13 can also be a nitride semiconductor containing Al element, such as $Al_xGa_yN$, and in the P-type semiconductor layer 13, the P-type semiconductor layer 13 contains Al element. In the direction from the channel layer 11 to the P-type semiconductor layer 13, the variation curve of the proportion of Al element in the channel layer 11, barrier layer 12, and P-type semiconductor layer 13 are continuous. In some embodiments, in a direction from the channel layer 11 to the P-type semiconductor layer 13, a derivative of the variation curve of the proportion of Al element with respect to a thickness is continuous. At the interface between the barrier layer 12 and the P-type semiconductor layer 13, the proportions of Al component in the barrier layer 12 and the P-type semiconductor layer 13 are the same, which can alleviate defects such as dislocations caused by differences in lattice constants and improve crystal quality, when the P-type semiconductor layer 13 is grown on the barrier layer 12.

In some embodiments, in a direction from the barrier layer 12 to the P-type semiconductor layer 13, the proportion of Al element in the P-type semiconductor layer 13 is constant, gradually decreases or first decreases to 0 and then remains at 0.

Figure 4:
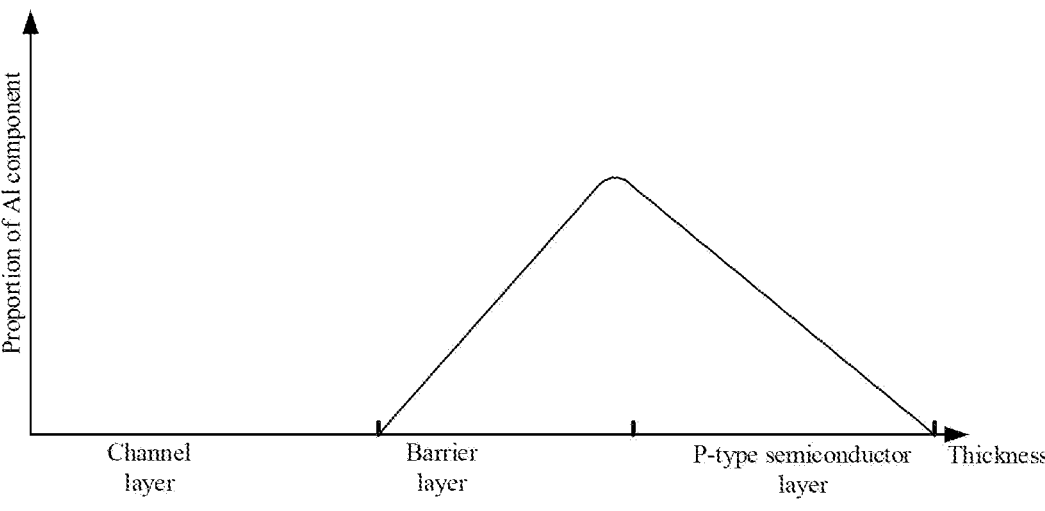
FIG. 4 is a variation curve of a proportion of Al component in a semiconductor structure according to embodiments of the present disclosure.

As shown in FIG. 4, FIG. 4 is a variation curve of a proportion of Al component in a semiconductor structure. In FIG. 4, the horizontal axis represents the thickness, and the vertical axis represents the proportion of Al component. It can be seen that as the thickness increases, the proportion of Al component in the barrier layer 12 and the P-type semiconductor layer 13 continuously varies, first increasing and then decreasing. The proportion of Al component in barrier layer 12 gradually increases, and the proportion of Al component in P-type semiconductor layer 13 gradually decreases. This is because in P-type semiconductors, excessive Al component can affect the doping efficiency of P-type doped ions (such as Mg ions). In the embodiments, the proportion of Al component in the P-type semiconductor layer 13 gradually decreases, to ensure the doping efficiency of P-type doped ions in the P-type semiconductor layer 13.

Figures 5, 6:
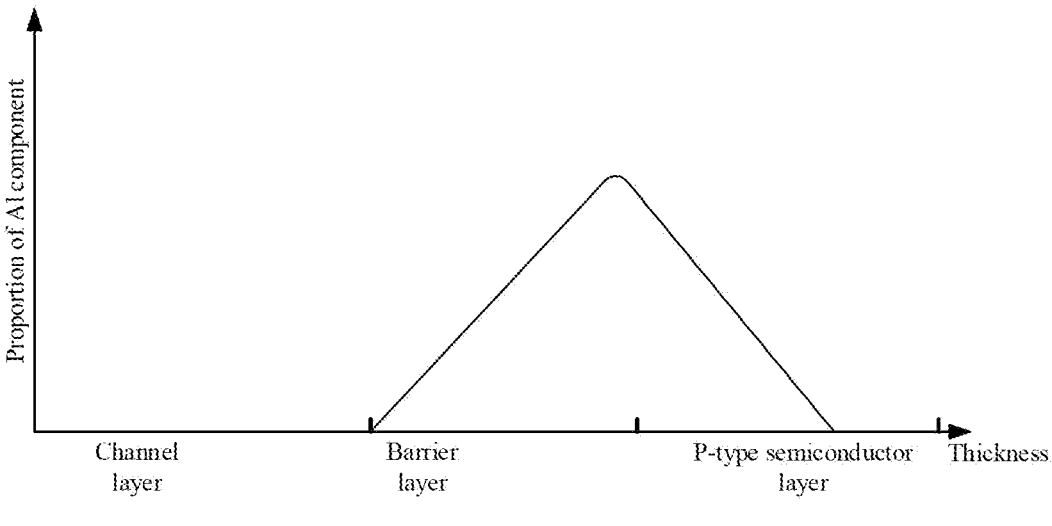
FIG. 5 is a variation curve of a proportion of Al component in a semiconductor structure according to embodiments of the present disclosure.
FIG. 6 is a variation curve of a proportion of Al component in a semiconductor structure according to embodiments of the present disclosure.

As shown in FIG. 5, FIG. 5 is a variation curve of a proportion of Al component in a semiconductor structure. In the embodiments, the proportion of Al component in the P-type semiconductor layer 13 gradually decreases to 0 and then remains at 0, that is, a portion of the P-type semiconductor layer 13 near the barrier layer 12 contains Al component, and a portion of the P-type semiconductor layer 13 far away from the barrier layer 12 does not contain Al component.

As shown in FIG. 6, FIG. 6 is a variation curve of a proportion of Al component in a semiconductor structure. In the embodiments, the Al component in barrier layer 12 gradually increases to a maximum value and then decreases. At the interface between the barrier layer 12 and the P-type semiconductor layer 13, the proportions of Al component in barrier layer 12 and P-type semiconductor layer 13 are the same, and the proportion of Al component in P-type semiconductor layer 13 remains constant.

In some embodiments, in a direction from the barrier layer 12 to the P-type semiconductor layer 13, a process of the proportion of Al element first increasing from a minimum to a maximum and then decreasing from the maximum to a minimum is a fluctuation period, and there is at least one fluctuation period from the barrier layer 12 to the P-type semiconductor layer 13. In some embodiments, there is one fluctuation period from the barrier layer 12 to the P-type semiconductor layer 13, and the maximum proportion of Al component is at the interface between barrier layer 12 and P-type semiconductor layer 13, or in barrier layer 12.

From the barrier layer 12 to the P-type semiconductor layer 13, there are multiple fluctuation periods, and the proportion of Al component at an interface of adjacent fluctuation periods continuously varies.

Figure 7:
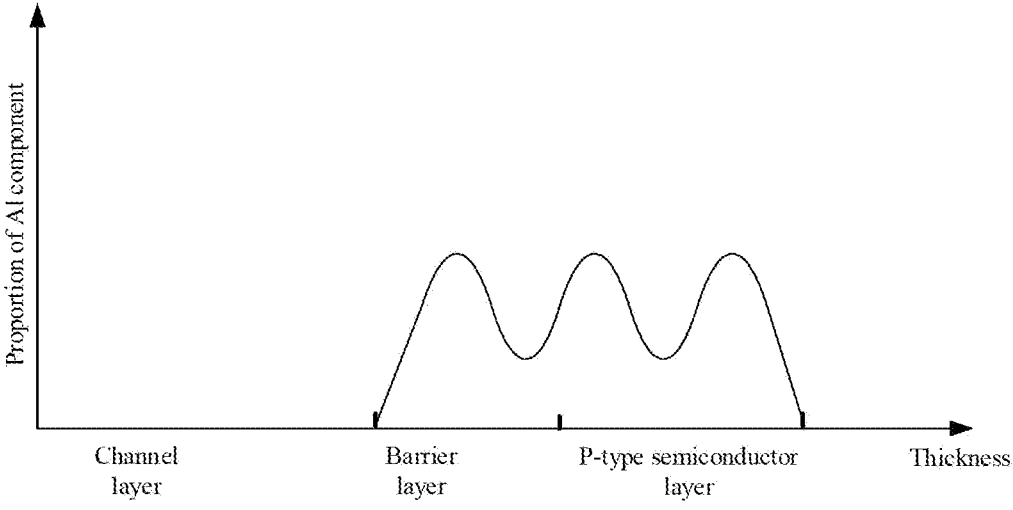
FIG. 7 is a variation curve of a proportion of Al component in a semiconductor structure according to embodiments of the present disclosure.
Figure 8:
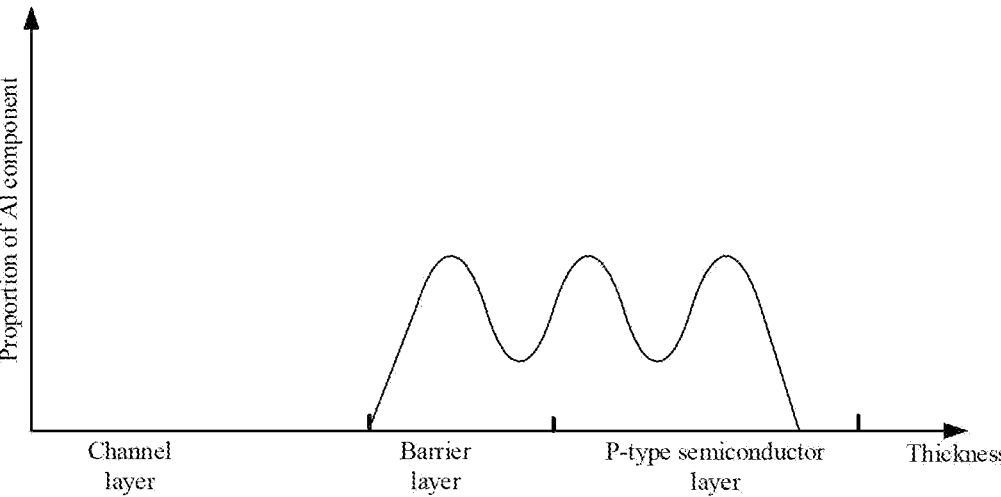
FIG. 8 is a variation curve of a proportion of Al component in a semiconductor structure according to embodiments of the present disclosure.

As shown in FIG. 7, FIG. 7 is a variation curve of a proportion of Al component in a semiconductor structure. In FIG. 7, the horizontal axis represents the thickness, and the vertical axis represents the proportion of Al component. It can be seen that there is no Al element doping in channel layer 11. The barrier layer 12 and the P-type semiconductor layer 13 are doped with Al element, and the barrier layer 12 and the P-type semiconductor layer 13 include multiple fluctuation periods. In each fluctuation period, the proportion of Al component increases first and then decreases. The proportion of Al component in barrier layer 12 increases from 0, which can create an energy level difference between the barrier layer 12 and the channel layer 11 to form a two-dimensional electron gas. The proportion of Al component in the P-type semiconductor layer 13 gradually decreases to 0 in the direction close to the surface of the P-type semiconductor layer 13, which can improve the doping of P-type doped ions (such as Mg ions). In some embodiments, as shown in FIG. 8, the proportion of Al component in a region close to the upper surface of the P-type semiconductor layer remains constant and 0.

In some embodiments, the maximum proportions of Al component in multiple fluctuation periods gradually decrease in the direction from the barrier layer 12 to the P-type semiconductor layer 13.

Figure 9:
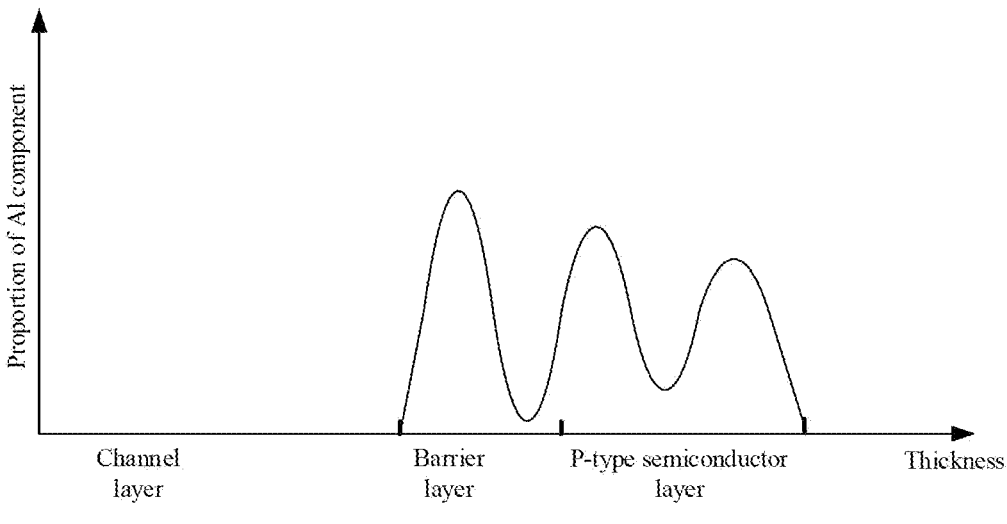
FIG. 9 is a variation curve of a proportion of Al component in a semiconductor structure according to embodiments of the present disclosure.

As shown in FIG. 9, FIG. 9 is a variation curve of a proportion of Al component in a semiconductor structure. In FIG. 9, the horizontal axis represents the thickness, and the vertical axis represents the proportion of Al component. It can be seen that as the thickness increases, the maximum proportions of Al component in multiple fluctuation periods in barrier layer 12 and P-type semiconductor layer 13 gradually decrease. Therefore, the proportion of Al component in the P-type semiconductor layer 13 is small, and it is easier to doping P-type doped ions in the P-type semiconductor layer 13.

Figure 10A:
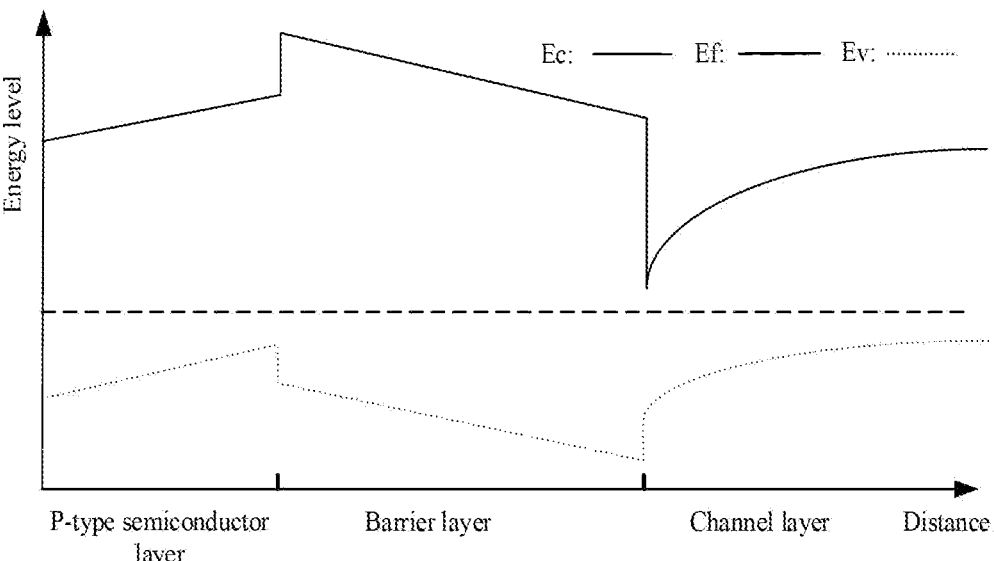
FIG. 10A is a curve of energy levels of a conduction band and a valence band in the P-type semiconductor layer, barrier layer, and channel layer when an Al component proportion curve at interfaces is discontinuous.
Figure 10B:
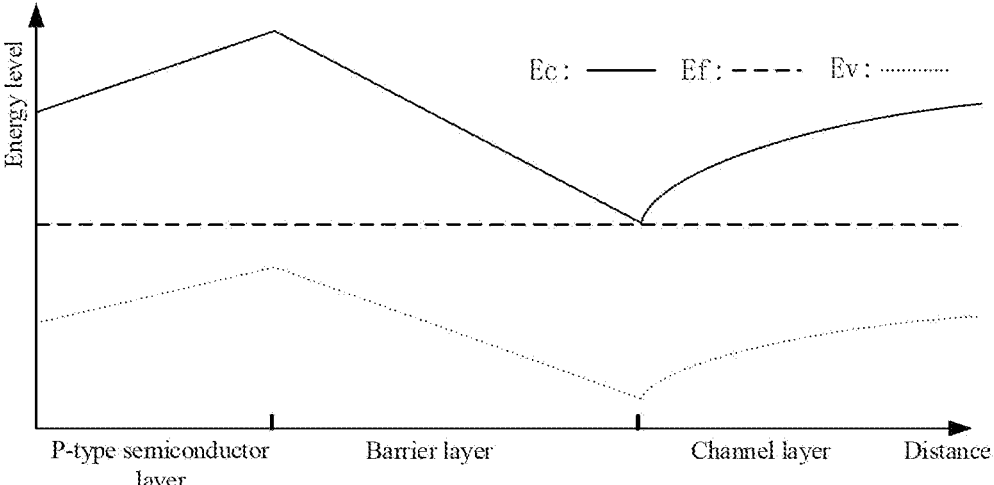
FIG. 10B is a curve of energy levels of a conduction band and a valence band in the P-type semiconductor layer, barrier layer, and channel layer when an Al component proportion curve at interfaces is continuous.

In addition, referring to FIGS. 10A and 10B, FIG. 10A is a curve of energy levels of a conduction band and a valence band in the P-type semiconductor layer, barrier layer, and channel layer when an Al component proportion curve at interfaces is discontinuous, and FIG. 10B is a curve of energy levels of a conduction band and a valence band in the P-type semiconductor layer, barrier layer, and channel layer when an Al component proportion curve at interfaces is continuous. In FIGS. 10A and 10B, the horizontal axis represents the distance to the surface of the P-type semiconductor layer, the vertical axis represents the energy level (eV), Ec represents the energy level of the conduction band, Ef represents the Fermi level, and Ev represents the energy level of the valence band. From FIG. 10A, it can be seen that in the P-type semiconductor layer, barrier layer, and channel layer, there is a jump of the conduction band at the interface of adjacent layers, resulting in a high concentration of two-dimensional electron gas at the interface between the channel layer and the barrier layer, which affects the control ability of the gate. In FIG. 10B, when the Al component at the interface is continuous, for the P-type semiconductor layer, barrier layer, and channel layer in which the proportion of a component continuously varies, the conduction band is continuous at the interface between adjacent layers. A flat conduction band below the Fermi level is formed at the interface of the barrier layer and the channel layer, which is beneficial for improving the control ability of the gate. By adjusting the proportion of Al component in the barrier layer, the linearity of the semiconductor structure under the high-frequency can be effectively controlled, the gate control ability can be improved, the threshold voltage can be further increased, the reverse leakage of the gate Schottky junction can be suppressed, and the breakdown voltage can be increased.

Figure 11:
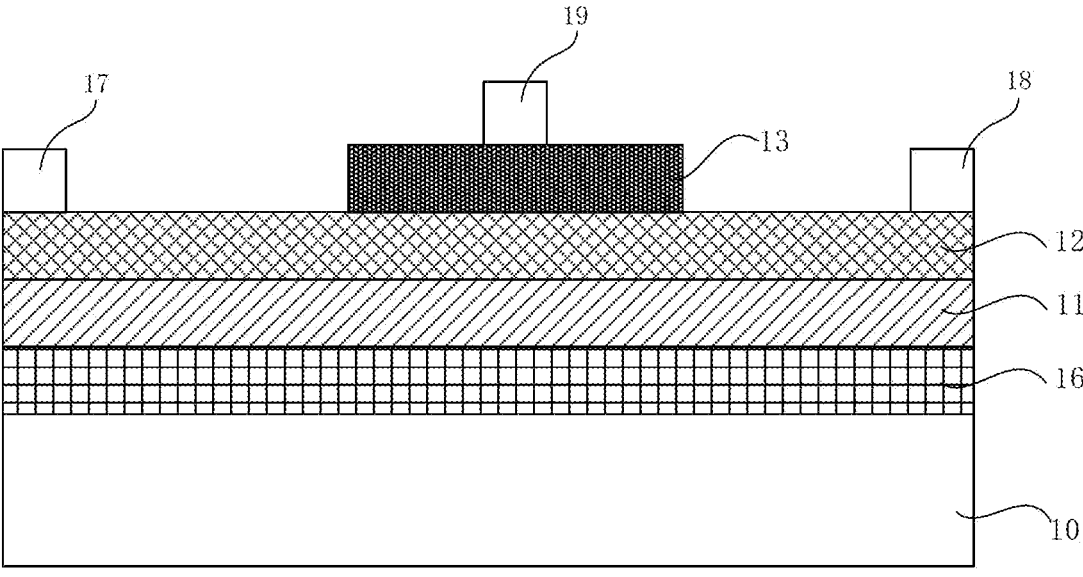
FIG. 11 is a schematic diagram of a semiconductor structure according to embodiments of the present disclosure.

In some embodiments, as shown in FIG. 11, the semiconductor structure further includes a back barrier layer 16 located on the side of the channel layer 11 away from the barrier layer 12. The back barrier layer 16 includes an Al element, where the proportion of Al element in the back barrier layer 16 is the same as the proportion of Al element in the channel layer 11 at the interface between the channel layer 11 and the back barrier layer 16.

The back barrier layer can also include a nitride semiconductor containing Al component, such as Al$_x$Ga$_y$N, and the proportion of Al component in the back barrier layer can continuously vary. In some embodiments, a back barrier layer in which the proportion of Al component gradually varies is provided, which can suppress the leakage caused by electron drift towards the back barrier in the channel under high voltage. At the same time, the back barrier layer in which the proportion of Al component gradually varies can be equivalent to countless small abrupt heterojunctions, and each of the small abrupt heterojunctions exists a polarized electric field.

In addition, in the semiconductor structure provided in the present disclosure, at the interface between the channel layer and barrier layer, the interface between the barrier layer and P-type semiconductor layer, and the interface between the channel layer and back barrier layer, the proportions of a component are the same, without any suddenly varying or jumps, and there is no component of which proportion suddenly varies or jumps in the channel layer, barrier layer, P-type semiconductor layer, and back barrier layer. The proportion of Al component continuously varies in different layers, which helps to alleviate stress problems in semiconductor layers caused by differences in lattice constants between different layers, reducing dislocations caused by lattice constant mismatch, and improving crystal quality.

Figures 12, 13:
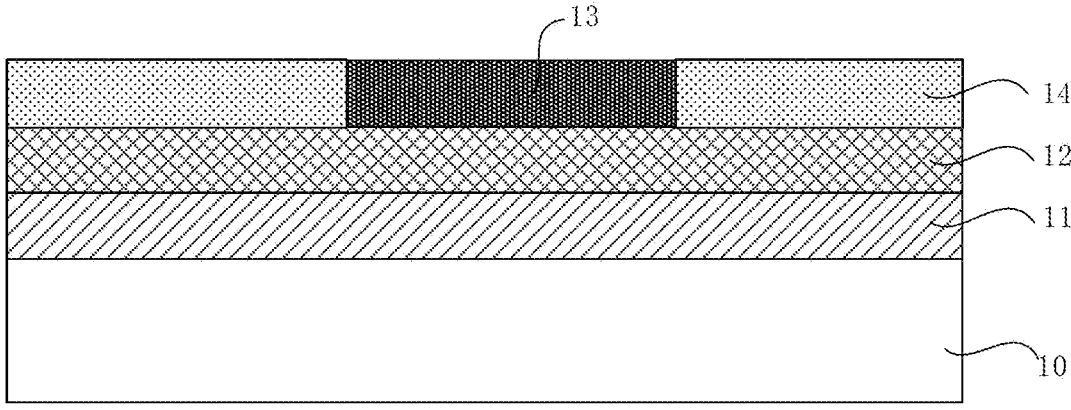
FIG. 12 is a schematic diagram of a semiconductor structure according to embodiments of the present disclosure.
FIG. 13 is a schematic diagram of a semiconductor structure according to embodiments of the present disclosure.

In some embodiments, as shown in FIG. 12, the semiconductor structure further includes an inactive layer 14 located on the upper surface of the barrier layer 12 and connected to the P-type semiconductor layer 13.

The P-type ions in the inactive layer 14, such as Mg ions bonded to H atoms, are in a passive state and can protect the barrier layer 12 from leakage.

In some embodiments, as shown in FIG. 13, the semiconductor structure further includes an ion passivation layer 15 located on the upper surface of the barrier layer 12 and connected to the P-type semiconductor layer 13.

The Mg ions in ion passivation layer 15 are bonded to H atoms and are in a passivation state, which can protect the barrier layer 12 from leakage.

The present disclosure further provides a manufacturing method of a semiconductor structure, including: sequentially forming a channel layer 11, a barrier layer 12, and a P-type semiconductor layer 13 on a substrate 10, where the channel layer 11 and the barrier layer 12 are both nitride semiconductors, the barrier layer 11 includes an Al element, and a variation curve of a proportion of Al element in the barrier layer 12 is continuous; where at an interface between the channel layer 11 and the barrier layer 12, the proportion of Al element in the barrier layer 12 is the same as the proportion of Al element in the channel layer 11; and at an interface between the barrier layer 11 and the P-type semiconductor layer 13, the proportion of Al element in the barrier layer 11 is the same as the proportion of Al element in the P-type semiconductor layer 13.

In some embodiment, the P-type semiconductor layer 13 contains an Al element, and a variation curve of the proportion of Al component in the channel layer 11, barrier layer 12, and P-type semiconductor layer 13 are continuous in the direction from the channel layer 11 to the P-type semiconductor layer 13.

The substrate 10 can include a sapphire substrate, SiC substrate, Si substrate, AlN substrate, or other monocrystal substrate that can be used for nitride epitaxial growth. The channel layer 11 and the barrier layer 12 can include a GaN-based material. For example, the channel layer 11 includes GaN, and the barrier layer 12 includes Al$_x$Ga$_y$N, where x represents the proportion of Al component in barrier layer 12. On the substrate 10, the channel layer 11 and barrier layer 12 are sequentially epitaxial grown, and through polarization-induced doping of Al element, a semiconductor structure in which the proportion of Al component continuously varies along the growth direction is achieved. At the interface between the channel layer 11 and the barrier layer 12, the proportion of Al element in barrier layer 12 is the same as the proportion of Al element in the channel layer 11 and both are 0. The embodiments and beneficial effects are similar to those described in the above structural embodiments, and will not be repeated here.

In some embodiments, in the direction from the barrier layer 12 to the P-type semiconductor layer 13, a process of the proportion of Al element first increasing from a minimum to a maximum and then decreasing from the maximum to a minimum is a fluctuation period. From the barrier layer 12 to the P-type semiconductor layer 13, there are multiple fluctuation periods, and the proportion of Al component continuously varies at the interface of adjacent fluctuation periods. The embodiments and beneficial effects are similar to those described in the above structural embodiments, and will not be repeated here.

In some embodiments, the maximum proportions of Al component in multiple fluctuation periods gradually decrease in the direction from the barrier layer 12 to the P-type semiconductor layer 13. The embodiments and beneficial effects are similar to those described in the above structural embodiments, and will not be repeated here.

Figure 14A:
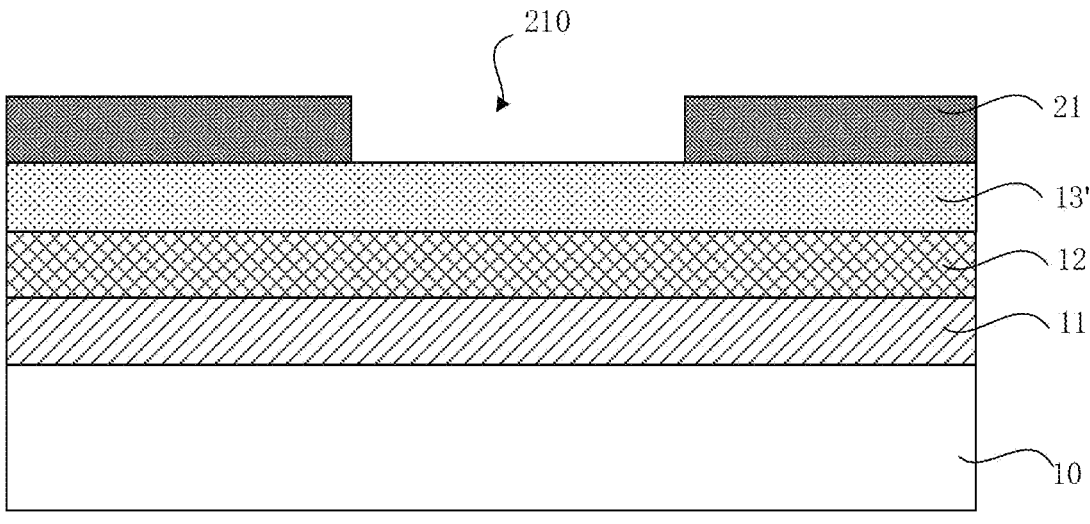
FIG. 14A is a schematic diagram of an intermediate structure of a semiconductor structure according to embodiments of the present disclosure.
Figure 14B:
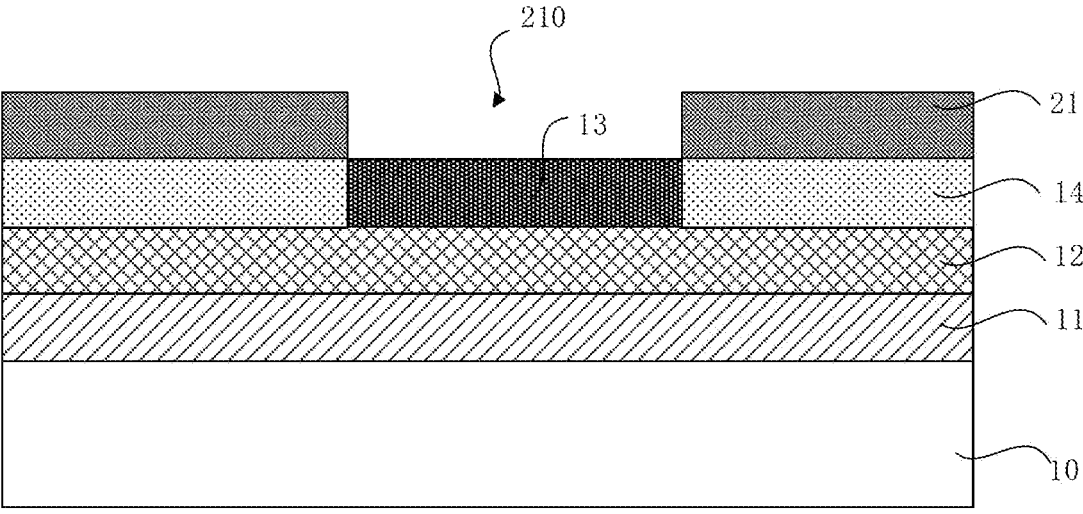
FIG. 14B is a schematic diagram of an intermediate structure of a semiconductor structure according to embodiments of the present disclosure.

In some embodiments, as shown in FIGS. 14A and 14B, providing the P-type semiconductor layer 13 includes: forming a P-type ion doped layer 13' on the surface of the barrier layer 12 far from the channel layer 11; forming a first mask layer 21 on a surface of the P-type ion doped layer 13' far from the barrier layer 12, where the first mask layer 21 has a first opening 210; activating P-type doped ions in the P-type ion doped layer 13' by using the first mask layer 21 as a mask, such that the P-type doped ions in the P-type ion doped layer 13' exposed by the first opening 210 are activated to form the P-type semiconductor layer 13, and the P-type doped ions in the P-type ion doped layer 13' covered by the first mask layer 21 are not activated to form an inactive layer 14.

The P-type doped ions (such as Mg ions) in the P-type ion doped layer 13' will bond with H atoms and do not exhibit P-type polarity. Therefore, it is necessary to activate the P-type doped ions in the P-type ion doped layer 13' to form the P-type semiconductor layer 13. For example, heating annealing can be used to activate P-type doped ions. In this embodiment, the first mask layer 21 with a first opening 210 is used to selectively activate P-type doped ions in the P-type ion doped layer 13', to form a P-type semiconductor layer 13. The inactive region in the P-type ion doped layer 13' is retained, to form the inactive layer 14. The beneficial effects are similar to those described in the structural embodiments, and will not be repeated here.

After the P-type semiconductor layer 13 is obtained, the first mask layer 21 can be removed by dry etching or wet etching.

Figure 15A:
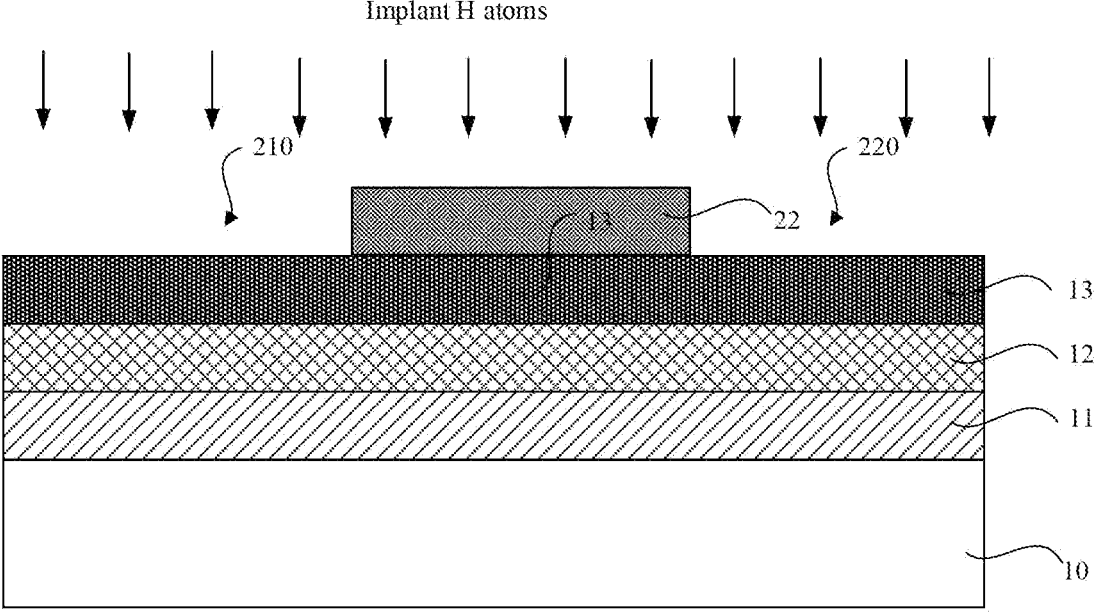
FIG. 15A is a schematic diagram of an intermediate structure of a semiconductor structure according to embodiments of the present disclosure.
Figure 15B:
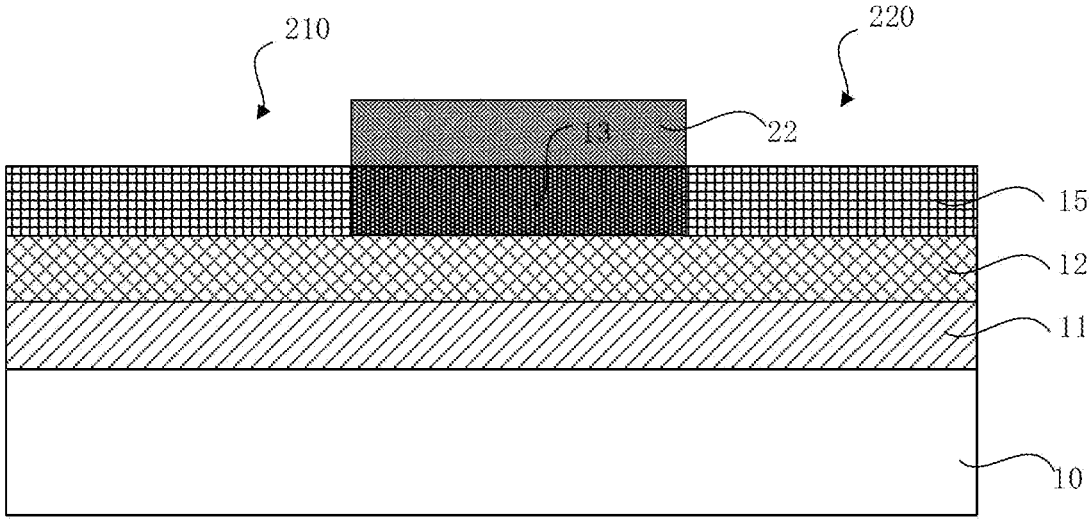
FIG. 15B is a schematic diagram of an intermediate structure of a semiconductor structure according to embodiments of the present disclosure.

In some embodiments, as shown in FIGS. 15A and 15B, providing the P-type semiconductor layer 13 includes: forming a P-type ion doped layer 13' on the surface of the barrier layer 12 far from the channel layer 11, activating P-type doped ions in the P-type ion doped layer 13' to form the P-type semiconductor layer 13; forming a second mask layer 22 on a surface of the P-type semiconductor layer 13 far from the barrier layer 12, and the second mask layer 22 has a second opening 220; and implanting H atoms into the P-type semiconductor layer 13 by using the second mask layer 22 as a mask, such that the P-type doped ions in the P-type semiconductor layer 13 exposed by the second opening 220 are passivated to form an ion passivation layer 15, and the P-type doped ions in the P-type semiconductor layer 13 covered by the second mask layer 22 are not passivated to retain the P-type semiconductor layer 13.

In this embodiment, after the P-type ion doped layer 13' is formed, the P-type ion doped layer 13' is first activated, and then H atoms are implanted into the exposed P-type ion doped layer 13' through the second mask layer 22 with a second opening 220 to bond the P-type doping ions (such as Mg ions) in the P-type ion doped layer 13' with H atoms, to form the ion passivation layer 15. The beneficial effects are similar to those described in the structural embodiments, and will not be repeated here.

Compared with the prior art, the beneficial effects of the technical solutions provided in the embodiments of the present disclosure are as follows.

In some embodiments, there is no difference in component proportion at the interface between the barrier layer and the channel layer, which reduces the spontaneous polarization and piezoelectric polarization at the interface, effectively reduces the 2DEG concentration at the interface. A flat conduction band below the Fermi level is formed at the interface, which is beneficial for improving the gate control ability of the semiconductor structure. A barrier layer includes a component of which proportion gradually varies, and at the interface between the barrier layer and the channel layer, a three-dimensional electron gas or three-dimensional hole gas is formed by polarization induced doping, which can improve the high-frequency linearity of the transistor. By adjusting the Al component proportion curve in the barrier layer, the linearity of the semiconductor structure under the high-frequency can be effectively controlled, the gate control ability can be improved, the threshold voltage can be further increased, the reverse leakage of the gate Schottky junction can be suppressed, and the breakdown voltage can be increased.

In some embodiments, in the P-type semiconductor layer, a high proportion of Al component will affect the doping efficiency of Mg impurities. In the embodiments of the present disclosure, in a direction from the barrier layer to the P-type semiconductor layer, the Al component in the P-type semiconductor layer gradually decreases, which can ensure the doping efficiency of P-type doped ions.

In some embodiments, a back barrier layer in which the proportion of Al component gradually varies is provided, which can suppress the leakage caused by electron drift towards the back barrier layer in the channel layer under high voltage. At the same time, the back barrier layer in which the proportion of Al component gradually varies can be equivalent to countless small abrupt heterojunctions, and each of the small abrupt heterojunctions exists a polarized electric field.

In some embodiments, there is no jumping of component proportion in the channel layer, barrier layer, P-type semiconductor layer, or back barrier layer. At the interface between the channel layer and barrier layer, the interface between barrier layer and P-type semiconductor layer, and the interface between the channel layer and back barrier layer, the proportion of the component is the same, and no jumping of component proportion. The Al component gradually varies in different layers, which can alleviate stress problems in the semiconductor layers caused by differences in lattice constants between different layers.

It should be noted that, while this specification contains many specific embodiments, these embodiments should not be understood as limiting the scope of any invention or what may be claimed, but are used to describe features of specific embodiments of particular inventions. Certain features described in a single embodiment in this specification may also be implemented in combination in other embodiments. On the other hand, the various features described in various embodiments can also be implemented in any suitable combination. Furthermore, although features may function as described above in certain combinations and even be originally claimed as such, one or more features from a claimed combination may in some cases be removed from the combination and the claimed protected combination may point to a subcombination or a variation of a subcombination.

Therefore, specific embodiments of the present disclosure have been described. Other embodiments are within the scope of the appended claims. In some cases, the features recited in the claims can be performed in a different order and still achieve the desirable result. In addition, the order of the features depicted in the accompanying drawings is not necessary in a particular order or sequential order to achieve the desirable results. In some implementations, it may also be multitasking and parallel processing.

The foregoing are only some embodiments of the present disclosure and are not intended to limit the present disclosure, and any modifications, equivalent substitutions, improvements, etc., made within the spirit and principles of the present disclosure shall be included within the scope of protection of the present disclosure.

What is claimed is:

1. A semiconductor structure, comprising:
a substrate, a channel layer, a barrier layer, and a P-type semiconductor layer that are distributed from bottom to top, wherein the barrier layer comprises an Al element, and a variation curve of a proportion of Al element in the barrier layer is continuous; wherein
at an interface between the channel layer and the barrier layer, the proportion of Al element in the barrier layer is the same as the proportion of Al element in the channel layer; and
at an interface between the barrier layer and the P-type semiconductor layer, the proportion of Al element in the barrier layer is the same as the proportion of Al element in the P-type semiconductor layer.

2. The semiconductor structure according to claim 1, wherein the P-type semiconductor layer comprises an Al element, and in a direction from the channel layer to the P-type semiconductor layer, a variation curve of the proportion of Al element in the channel layer, the barrier layer, and the P-type semiconductor layer is continuous.

3. The semiconductor structure according to claim 1, wherein in a direction from the channel layer to the P-type semiconductor layer, a derivative of the variation curve of the proportion of Al element with respect to a thickness is continuous.

4. The semiconductor structure according to claim 1, wherein in a direction from the channel layer to the barrier layer, the barrier layer comprises one or more of a region with the proportion of Al element increasing, a region with the proportion of Al element decreasing, or a region with the proportion of Al element being constant.

5. The semiconductor structure according to claim 1, wherein in a direction from the channel layer to the barrier layer, a process of the proportion of Al element first increasing from a minimum to a maximum and then decreasing from the maximum to a minimum is a fluctuation period, and the barrier layer comprises at least one fluctuation period.

6. The semiconductor structure according to claim 5, wherein in the direction from the channel layer to the barrier layer, in the at least one fluctuation period, an increasing speed of the proportion of Al element is greater than a decreasing speed of the proportion of Al element.

7. The semiconductor structure according to claim 2, wherein in a direction from the barrier layer to the P-type semiconductor layer, the proportion of Al element in the P-type semiconductor layer is constant, gradually decreases or first decreases to 0 and then remains at 0.

8. The semiconductor structure according to claim 2, wherein in a direction from the barrier layer to the P-type semiconductor layer, a process of the proportion of Al element first increasing from a minimum to a maximum and then decreasing from the maximum to a minimum is a fluctuation period, and there is at least one fluctuation period from the barrier layer to the P-type semiconductor layer.

9. The semiconductor structure according to claim 8, wherein there is one fluctuation period from the barrier layer to the P-type semiconductor layer, and a maximum value of the proportion of Al element is located at an interface between the barrier layer and the P-type semiconductor layer or in the barrier layer.

10. The semiconductor structure according to claim 8, wherein there are multiple fluctuation periods from the barrier layer to the P-type semiconductor layer, and in the direction from the barrier layer to the P-type semiconductor layer, maximum values of the proportion of Al element in the multiple fluctuation periods gradually decreases.

11. The semiconductor structure according to claim 1, further comprising:
a back barrier layer located on a side of the channel layer far from the barrier layer, wherein the back barrier layer comprises an Al element, and at an interface between the channel layer and the back barrier layer, the proportion of Al element in the back barrier layer is the same as the proportion of Al element in the channel layer.

12. The semiconductor structure according to claim 1, further comprising:
an inactive layer located on an upper surface of the barrier layer and connected to the P-type semiconductor layer.

13. The semiconductor structure according to claim 1, further comprising:
an ion passivation layer located on an upper surface of the barrier layer and connected to the P-type semiconductor layer.

14. A manufacturing method of a semiconductor structure, comprising:
sequentially forming a channel layer, a barrier layer, and a P-type semiconductor layer on a substrate, wherein the barrier layer comprises an Al element, and a variation curve of a proportion of Al element in the barrier layer is continuous; wherein
at an interface between the channel layer and the barrier layer, the proportion of Al element in the barrier layer is the same as the proportion of Al element in the channel layer; and
at an interface between the barrier layer and the P-type semiconductor layer, the proportion of Al element in the barrier layer is the same as the proportion of Al element in the P-type semiconductor layer.

15. The manufacturing method according to claim 14, wherein the P-type semiconductor layer comprises an Al element, and in a direction from the channel layer to the P-type semiconductor layer, a variation curve of the proportion of Al element in the channel layer, the barrier layer, and the P-type semiconductor layer is continuous.

16. The manufacturing method according to claim 14, wherein forming the P-type semiconductor layer comprises:
forming a P-type ion doped layer on a surface of the barrier layer far from the channel layer;
forming a first mask layer on a surface of the P-type ion doped layer far from the barrier layer, wherein the first mask layer has a first opening; and
activating P-type doped ions in the P-type ion doped layer by using the first mask layer as a mask, such that the P-type doped ions in the P-type ion doped layer exposed by the first opening are activated to form the P-type semiconductor layer, and the P-type doped ions in the P-type ion doped layer covered by the first mask layer are not activated to form an inactive layer.

17. The manufacturing method according to claim 14, wherein forming the P-type semiconductor layer comprises:
forming a P-type ion doped layer on a surface of the barrier layer far from the channel layer, activating P-type doped ions in the P-type ion doped layer to form the P-type semiconductor layer;

forming a second mask layer on a surface of the P-type semiconductor layer far from the barrier layer, and the second mask layer has a second opening; and implanting H atoms into the P-type semiconductor layer by using the second mask layer as a mask, such that the P-type doped ions in the P-type semiconductor layer exposed by the second opening are passivated to form an ion passivation layer, and the P-type doped ions in the P-type semiconductor layer covered by the second mask layer are not passivated to retain the P-type semiconductor layer.

* * * * *